(12) United States Patent
Engholm et al.

(10) Patent No.: US 8,184,121 B2
(45) Date of Patent: May 22, 2012

(54) METHODS, SYSTEMS, AND APPARATUS FOR MULTI-DOMAIN MARKERS

(75) Inventors: Kathryn A. Engholm, Portland, OR (US); Craig D. Bryant, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 1053 days.

(21) Appl. No.: 12/092,565

(22) PCT Filed: Nov. 3, 2006

(86) PCT No.: PCT/US2006/060545
§ 371 (c)(1),
(2), (4) Date: May 2, 2008

(87) PCT Pub. No.: WO2007/076174
PCT Pub. Date: Jul. 5, 2007

(65) Prior Publication Data
US 2008/0259082 A1 Oct. 23, 2008

Related U.S. Application Data (60) Provisional application No. 60/734,015, filed on Nov. 4, 2005.

(51) Int. Cl.
*G06T 11/20* (2006.01)
(52) U.S. Cl. ....................................... 345/440
(58) Field of Classification Search ................. None
See application file for complete search history.

(56) References Cited

U.S. PATENT DOCUMENTS

| 5,187,789 | A | * | 2/1993 | O'Hair | 1/1 |
| 5,444,670 | A | * | 8/1995 | Douglas | 367/90 |
| 5,617,523 | A | * | 4/1997 | Imazu et al. | 345/440 |
| 5,739,823 | A | * | 4/1998 | Akaza et al. | 345/440 |
| 5,909,192 | A | * | 6/1999 | Finch et al. | 342/182 |
| 6,196,972 | B1 | * | 3/2001 | Moehring | 600/454 |
| 6,603,477 | B1 | * | 8/2003 | Tittle | 345/440 |
| 6,799,712 | B1 | * | 10/2004 | Austen et al. | 228/102 |
| 7,509,861 | B2 | * | 3/2009 | Masotti et al. | 73/659 |
| 7,539,549 | B1 | * | 5/2009 | Discenzo et al. | 700/28 |
| 2002/0154173 | A1 | * | 10/2002 | Etgen et al. | 345/833 |
| 2002/0183948 | A1 | * | 12/2002 | Qian et al. | 702/75 |
| 2003/0144088 | A1 | * | 7/2003 | Shoane | 473/405 |
| 2004/0100467 | A1 | * | 5/2004 | Heaton | 345/440 |
| 2004/0204635 | A1 | * | 10/2004 | Scharf et al. | 600/323 |
| 2004/0227738 | A1 | * | 11/2004 | Sudoh | 345/173 |
| 2005/0246366 | A1 | * | 11/2005 | Kouchi et al. | 707/102 |
| 2006/0276971 | A1 | * | 12/2006 | Mohr | 702/19 |
| 2009/0043196 | A1 | * | 2/2009 | Sakai et al. | 600/437 |

FOREIGN PATENT DOCUMENTS
JP  61-275665  5/1986
* cited by examiner

*Primary Examiner* — Joni Hsu
*Assistant Examiner* — David H Chu
(74) *Attorney, Agent, or Firm* — Michael A. Nelson (57) ABSTRACT

Embodiments of the present invention comprise methods, systems, and apparatus for multi-domain markers.

19 Claims, 10 Drawing Sheets

FIG. 5 ns, and apparatus for multi-domain markers.

METHODS, SYSTEMS, AND APPARATUS FOR MULTI-DOMAIN MARKERS

RELATED REFERENCES

This application claims the benefit of U.S. Provisional Patent Application No. 60/734,015, entitled "Global Multi-domain Correlated Markers," filed on Nov. 4, 2005.

FIELD OF THE INVENTION

Embodiments of the present invention comprise methods, systems, and apparatus for multi-domain markers.

BACKGROUND

A plurality of measurement data sets may be stored related to input data. Exemplary measurement data sets include frequency-domain measurement data sets, time-domain measurement data sets, modulation-analysis measurement data sets, spectrogram measurement data sets, or codogram measurement data sets.

SUMMARY

Some embodiments of the present invention comprise methods, systems, and apparatus for displaying correlated display markers in multiple visual representations on a measurement display device.

Some embodiments of the present invention comprise a marker construct wherein the marker construct may have multiple domain attributes. In some embodiments of the present invention, the marker construct may be used by a marker correlator to manage marker display.

The foregoing and other objectives, features, and advantages of the invention will be more readily understood upon consideration of the following detailed description of the invention taken in conjunction with the accompanying drawings.

DETAILED DESCRIPTION OF EXEMPLARY EMBODIMENTS

Embodiments of the present invention will be best understood by reference to the drawings, wherein like parts are designated by like numerals throughout. The figures listed above are expressly incorporated as part of this detailed description.

It will be readily understood that the components of the present invention, as generally described and illustrated in the figures herein, could be arranged and designed in a wide variety of different configurations. Thus, the following more detailed description of the embodiments of the methods, systems, and apparatus of the present invention is not intended to limit the scope of the invention, but it is merely representative of the presently preferred embodiments of the invention.

Elements of embodiments of the present invention may be embodied in hardware, firmware and/or software. While exemplary embodiments revealed herein may only describe one of these forms, it is to be understood that one skilled in the art would be able to effectuate these elements in any of these forms while resting within the scope of the present invention.

A display device, for example, an oscilloscope, a logic analyzer, a spectrum analyzer, or a computer monitor, may display a plurality of visual representations related to measurements computed on one or more data records. Exemplary visual representations may comprise frequency-domain visual representations, time-domain visual representations, modulation-analysis visual representations, spectrogram visual representations, codogram visual representations, and other visual representations.

A visual representation may be a waveform trace, graph, plot, or other visual representation of a set of domain values and corresponding range values. The measurement data associated with a visual representation may be stored on the display device, a measurement instrument, or an off-instrument data storage medium that may or may not reside on a remote computing device. For a visual representation comprising a spectrogram, the measurement data associated with the visual representation may comprise a range value for each pair of domain values, where one domain is time and the other is frequency, where the range value represents the amplitude at the frequency indicated by the frequency value in the time slice indicated by the time value.

A display marker may be placed on or moved along a waveform trace, or other visual representation, to visually identify a point on the visual representation. A display marker may be used to extract a readout of the domain value and the range value represented by the marked point on the visual representation. A display marker may be placed on a visual representation by a user of the instrument or display, or by an automated process. A marker readout of the domain value and the range value represented by the point on which the display marker is placed may be displayed on the device display. A display marker may be dragged along or moved within a visual representation by a user or by an automated process, and the marker readout may update as the position of the display marker changes.

Figure 1:
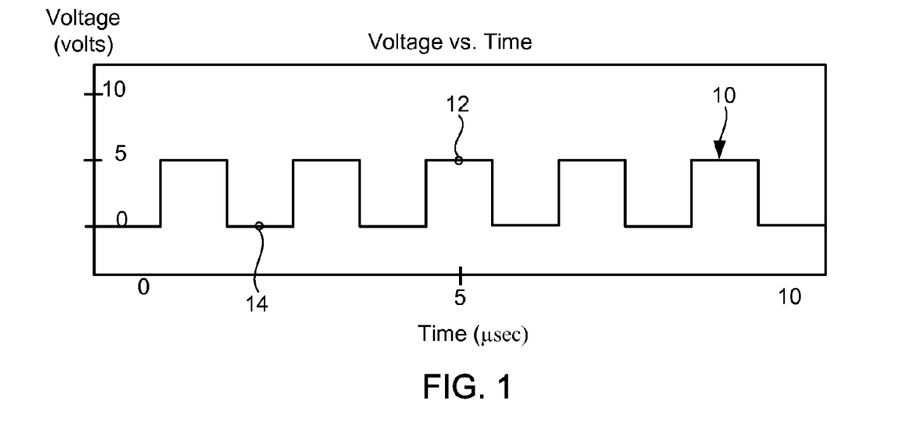
FIG. 1 is a diagram depicting a waveform and multiple marker locations.

For example, in the voltage-versus-time visual representation shown in FIG. 1, a display marker placed on the waveform 10 at position 12 may result in a readout of (5 microseconds (μsec), 5 volts); while a marker placed on the waveform 10 at position 14 may result in a readout of (2 μsec, 0 volts).

Some embodiments of the present invention may comprise a marker construct associated with a display marker. For the example illustrated in FIG. 1, a marker construct associated with the display marker may contain a time-domain value corresponding to time value 5 μsec when the display marker is displayed at location 12. The time-domain value may be an absolute time reference or it may be an index value corresponding to the time value. When the display marker is at location 14, the marker construct may contain a time-domain indicator corresponding to time value 2 μsec.

In some embodiments of the present invention, a marker construct may exist irrespective of a display marker.

A marker construct may comprise a plurality of location values, each of which corresponds to a different domain. A marker construct may be a time-domain marker construct, a frequency-domain marker construct, or a multi-domain marker construct. An exemplary multi-domain marker construct may comprise a location value corresponding to the time domain and a location value corresponding to the frequency domain.

A multi-domain marker construct may comprise a plurality of location values for denoting domain locations of interest in multiple domains. In some embodiments of the present invention, a multi-domain marker construct may require explicit definition of each of the plurality of domains that the marker construct is to support. In alternate embodiments of the present invention, a multi-domain marker construct may adaptively add domain support when a measurement data set with a domain not represented in the multi-domain marker is accessed in a display or processing session. For example, if a time-domain visual representation is initially displayed, a multi-domain marker construct may have a time-domain attribute. Then if a user displays another measurement in a different domain, for example, the frequency domain, the multi-domain marker construct may add a frequency-domain attribute.

In some embodiments of the present invention, a marker construct may be queried by a marker-display process or other process for a domain value in order that the marker-display process or other process may access measurement data using the domain value to retrieve domain and range value data to display a display marker on a visual representation or otherwise use or process the data. In alternate embodiments, upon query from a marker-display process or other process, the marker construct may access the measurement data directly and report to the marker-display process or other process the requested domain and range value data.

In still alternate embodiments, the marker construct may deliver or report domain and range value data to display processes or other processes not associated with a display, such as a calculation process, a reporting process, an archiving process, an acquisition process, or other measurement-based process, without a query from the process.

When a plurality of visual representations are displayed, placement of a display marker in a first visual representation may result in the display of a display marker in another visual representation at a correlated location. The visual representation in which the display marker is being placed, moved, dragged, or otherwise manipulated by either a user or an automated control process, may be referred to as the placement visual representation. The other visual representations may be referred to as the alternate visual representations. An alternate visual representation may become the placement visual representation when the display marker is manipulated in that visual representation, and then the other visual representations become alternate visual representations. In some embodiments of the present invention, a display marker may be manipulated using a pointing device, a series of keyboard strokes, or other input device.

In some embodiments of the present invention, a marker correlator may be used to manage the display of correlated display markers in a plurality of visual representations. The marker correlator may manage the display of correlated display markers in alternate visual representations when a display marker is moved or placed in a placement visual representation. In some embodiments of the present invention, the marker correlator may manage the readout associated with a display marker. The marker correlator may manage the appearance, for example, the color, the size, the iconic form, or other physical, display attributes, of a display marker in the placement visual representation or the alternate visual representations.

In some embodiments of the present invention, a marker correlator may be embodied in software, hardware, firmware, or a combination of software, hardware, and firmware. In some embodiments of the present invention, a marker correlator may reside physically or execute in a single location or be distributed among components in a measurement and display system.

In some embodiments of the present invention, a marker correlator may manage the display of correlated display markers using a single marker construct with multiple domain attributes.

In some embodiments of the present invention, placement of a display marker in a first visual representation, considered the placement visual representation, may result, under the management or direction of a marker correlator, in the display of a corresponding, correlated display marker in a second, or alternate, visual representation only when the data underlying each visual representation overlaps.

Figure 2A:
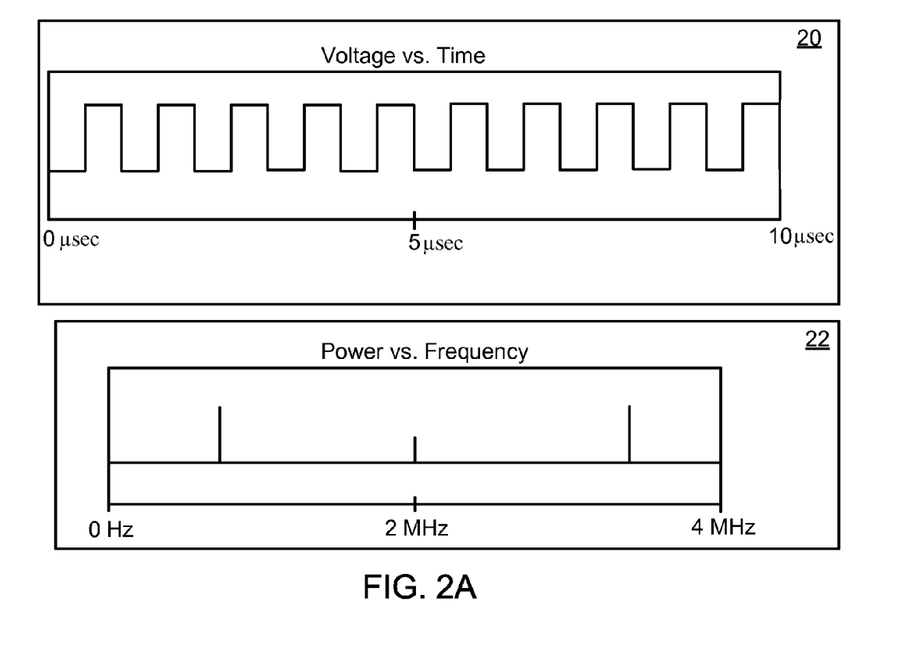
FIG. 2A is a diagram depicting two visual representations: a time-domain visual representation and a frequency-domain visual representation.

By way of illustration, consider FIG. 2A in which two visual representations of a measurement based on an underlying data record comprising 10 microseconds of data samples with a frequency range of 0 MHz to 4 MHz are shown. In the first visual representation 20, voltage versus time is shown based on the entire set of data in the data record. In the second visual representation 22, power versus frequency is shown, wherein the first one microsecond of data in the data record is used to produce the power-versus-frequency waveform.

Figure 2B:
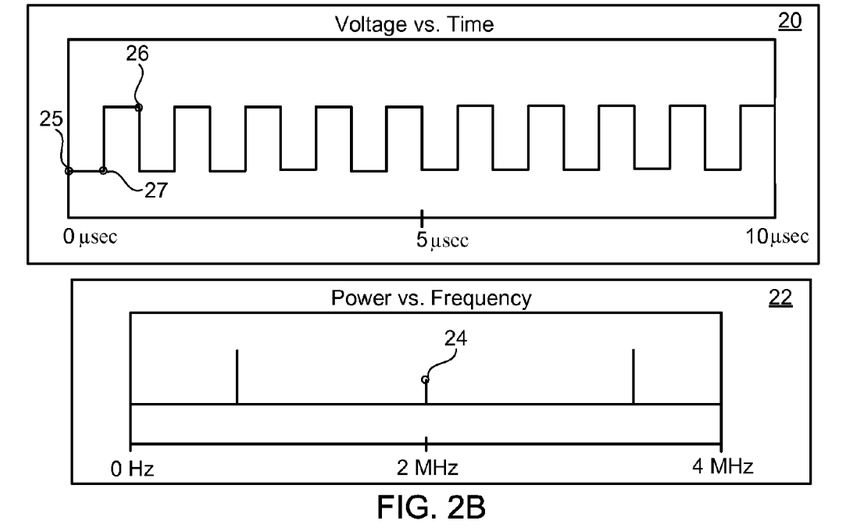
FIG. 2B is a diagram illustrating embodiments of the present invention in which a marker in the frequency-domain visual representation may be placed at any location in the time-domain visual representation for which the time data is that which underlies the calculation of the frequency spectra.

Some embodiments of the present invention may be described with reference to FIG. 2B. In these embodiments, when a display marker is placed at any frequency location, for example at location 24 in the second visual representation 22, a marker correlator may induce a corresponding, correlated display marker to be displayed at any location in the time range 0 μsec to 1 μsec in the first visual representation 20, as this is the underlying data range corresponding to any frequency in the second visual representation 22.

In this example, the second visual representation 22 may be referred to as the placement visual representation as the display marker is being manipulated in that visual representation. Other corresponding visual representations that contain correlated display markers may be referred to as alternate visual representations. In some embodiments of the present invention, when a correlated display marker may be displayed at any location in an interval or range of locations, the correlated display marker may be displayed according to a placement rule used by the marker correlator. The placement rule may be a default rule, a user/viewer selected rule, a rule based on the domain of the visual representation, a rule based on the range of the visual representation, or any other predefined or adaptive rule. In some embodiments of the present invention, the placement rule may be such that the corresponding, correlated display marker may be placed in the alternate visual representation 20 at the location corresponding to the lower limit of the underlying data range, location 25 in the first visual representation 20. In alternate embodiments, the placement rule may be such that the display marker in the alternate visual representation 20 may be placed at the location corresponding to the upper limit of the underlying data range, location 26 in the first visual representation 20. In still alternate embodiments, the placement rule may be such that the marker correlator may direct the placement of the display marker in the alternate visual representation 20 to be at the center value of the underlying data range, location 27.

Figure 2C:
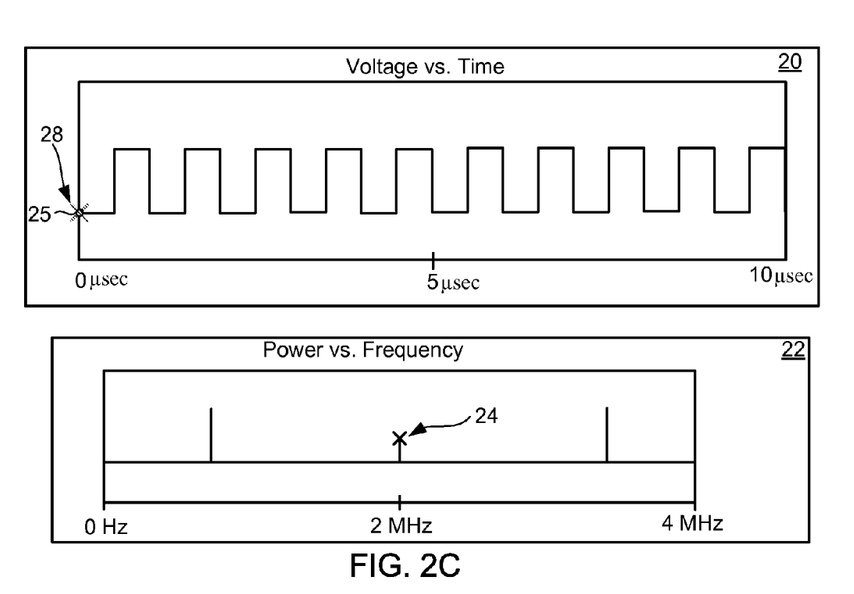
FIG. 2C is a diagram illustrating embodiments of the present invention in which a marker is a single symbol.
Figure 2D:
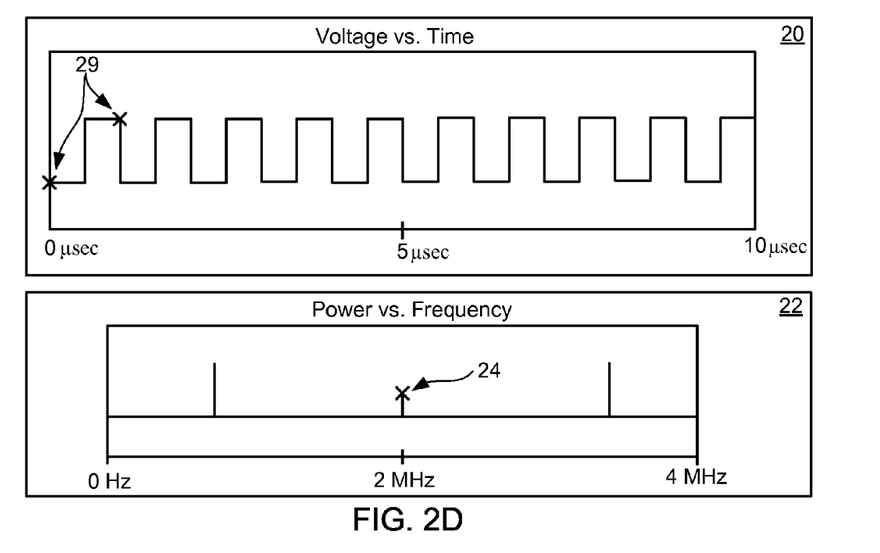
FIG. 2D is a diagram illustrating embodiments of the present invention in which a marker is a pair of symbols.

According to a representation definition used by the marker correlator, the display marker may appear as a single symbol 28 at the determined location, as shown in FIG. 2C at location 25. In alternate embodiments, the interval-representation definition used by the marker correlator may be such that the display marker may appear as a pair of symbols 29, as shown in FIG. 2D, a line, or other graphic delineating the entire range. The representation definition may be a default definition, a user/viewer selected definition, a definition based on the domain of the visual representation, a definition based on the range of the visual representation, or any other predefined or adaptively determined definition.

The underlying data in the data record to which the frequencies in the second visual representation 22 correspond is the time data from 0 μsec to 1 μsec shown in the first visual representation 20. Therefore placement, or manipulation, of a display marker in the second visual representation 22 at any location may result in the display, or movement, of a corresponding, correlated display marker in the first visual representation 20 at any location within that corresponding data range as described above.

In some embodiments of the present invention, movement of a display marker in a placement visual representation may not result in movement of the corresponding, correlated display marker in an alternate visual representation. Movement of the display marker in the second visual representation 22 may not result in movement of the corresponding display marker in the first visual representation 20, in the example in FIG. 2A, because any frequency in the second visual representation 22 corresponds to the same underlying time data. A marker correlator may determine that movement of a display marker in a placement visual representation does not require movement of a correlated display marker in an alternate visual representation when the underlying data of the placement visual representation does not have a one-to-one correspondence with the underlying data of the alternate visual representation, and the location of the currently displayed display marker in the alternate visual representation is supported by the new placement location. Movement, in the example of FIG. 2A, of the display marker in the first visual representation 20 may not result in movement of the corresponding marker in the second visual representation 22 until the display marker in the first visual representation 20 is moved out of the range of underlying data for the second visual representation 22.

In some embodiments of the present invention, if a display marker is displayed in multiple visual representations, and the display marker is moved to a location in a placement visual representation for which the underlying data has no overlap in an alternate visual representation, a marker correlator may effectuate the removal from the display of the corresponding, correlated display marker in the alternate visual representation. The removal of the correlated display marker may be done according to a removal rule used by the marker correlator. The removal rule may be a default rule, a user/viewer selected rule, a rule based on the domain of the visual representation, a rule based on the range of the visual representation, or any other predefined or adaptive rule. The removal rule may be such that the display marker in the alternate display is not displayed. The removal rule may be such that the display marker in the alternate display is displayed in an alternative fashion, for example reverse video, highlighted, alternate color, or alternate shape, according to the removal rule. In some embodiments, a message or other indication as to the removal or change in appearance of the display marker may be displayed. The message or other indication may be in the region of the display marker readout or other area on the display. In some embodiments, the location of the message or other indication may be controlled by the marker correlator.

Figure 2E:
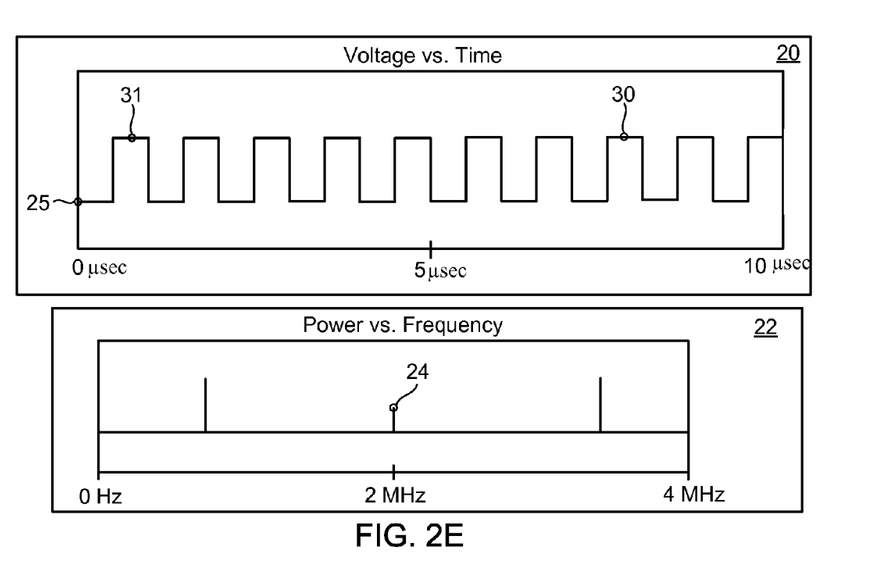
FIG. 2E is a diagram illustrating embodiments of the present invention in which marker locations in one visual representation may not have corresponding marker locations in an alternate visual representation.

In the example illustrated in FIG. 2A-2D, if the display marker is moved to position 30 from position 25, as shown in FIG. 2E, in the first visual representation 20, then the correlated display marker that was at position 24 in the second visual representation may no longer be displayed, or its appearance may change, since the time corresponding to position 30 (7.5 μsec) is not in the underlying data from which the second visual representation 22 was generated. If the display marker is moved to position 31 from position 30 in the first visual representation 20, then the corresponding, correlated display marker in the second visual representation 22 will reappear in the second visual representation 22. In some embodiments of the present invention, when a display marker reappears in a visual representation, the display marker may be located under the direction of the marker correlator according to the placement rules for the first appearance of the display marker, for example according to any of the placement rules as previously described above, or in alternate embodiments, under the control of the marker correlator, the display marker may reappear at its last location in the visual representation, in this example location 24 in the second visual representation 22.

In some embodiments of the present invention, subsequent movement of a display marker in a visual representation, may result, under the control of the marker correlator, in corresponding movement of the corresponding, correlated display markers in the other, alternate visual representations.

In some embodiments of the present invention, the marker correlator may control a plurality of display markers in multiple visual representations in which some of the visual representations are in the same domain. In these embodiments, a display marker may be placed or manipulated in any visual representation, the placement visual representation, and the display of a corresponding, correlated display marker in any of the alternate visual representations may be governed by the marker correlator according to the overlap of underlying data in the data record.

Figure 3:
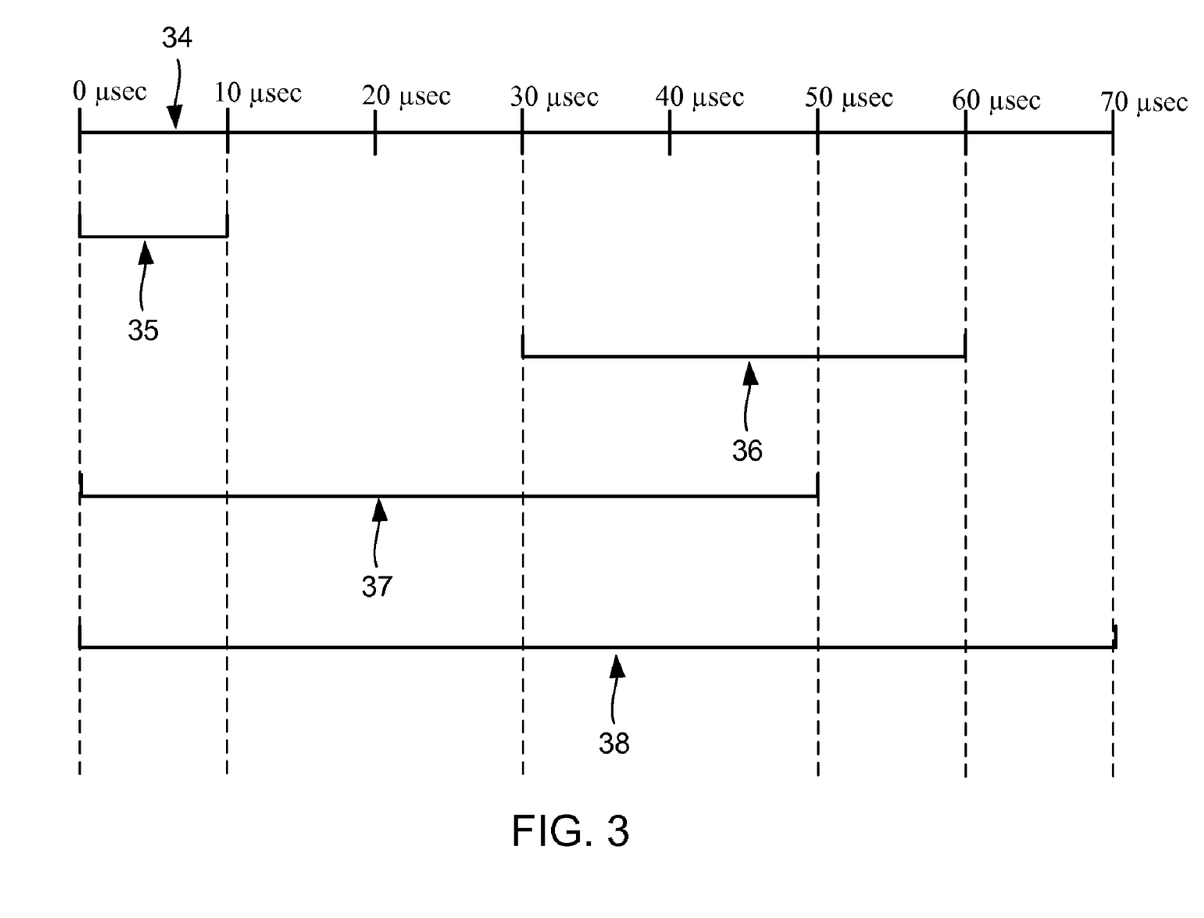
FIG. 3 is a diagram illustrating underlying data in a data record supporting multiple visual representations.

For example, FIG. 3 depicts a data record 34 on which four visual representations may be based. The first visual representation may be a time-domain visual representation based on data 35 in the time range from 0 μsec to 10 μsec of the data record 34. The second visual representation may be a time-domain visual representation based on data 36 in the time range from 30 μsec to 60 μsec of the data record 34. The third visual representation may be a time-domain visual representation based on data 37 in the time range from 0 μsec to 50 μsec of the data record 34. The fourth visual representation may be a time-domain visual representation based on data 38 in the time range from 0 μsec to 70 μsec of the data record 34.

In this example, if a display marker is placed or moved anywhere in the first visual representation, which is then referred to as the placement visual representation, corresponding, correlated display markers may be displayed as directed by the marker correlator in alternate visual representations, such as the third visual representation and the fourth visual representation due to the overlap of the data 35 for the first visual representation with that of the third and fourth visual representations, 37 and 38, respectively. If a display marker is placed or moved anywhere in the second visual representation, which is then referred to as the placement visual representation, a corresponding, correlated display marker may be displayed as directed by the marker correlator in the third and fourth alternate visual representations due to the overlap of the data 38 for the fourth visual representation with the data 36 of the second visual representation. However, if a display marker in the second visual representation is placed or moved in the range of 30 μsec and 50 μsec, the marker correlator may effectuate the appearance of a corresponding, correlated display marker in the third alternate visual representation because, in this range, the underlying data range is common to both visual representations.

In some embodiments of the present invention, a marker correlator may restrict display of a display marker in a first visual representation corresponding to a display marker in a second visual representation when the underlying data regions associated with the two visual representations are disjoint. In the example depicted in FIG. 3, a display marker in the first visual representation may not display a corresponding, correlated display marker in the second visual representation due to the disjoint underlying data regions associated with the first visual representation 35 and the second visual representation 36. In some embodiments, the readout for a display marker in a visual representation for which there is no underlying data overlap may indicate that there is no overlap. The indication may be in the readout region or other display region. In some embodiments the visual, display appearance of the indication may be determined by the marker correlator. In some embodiments, the region in which the indication may be displayed by be determined by the marker correlator.

In some embodiments of the present invention, a marker correlator may manage a plurality of display markers: a display marker on a first visual representation with a first domain, a display marker on a second visual representation with a second domain, and a display marker on a third visual representation with an axis corresponding to the first domain and an axis corresponding to the second domain. An exemplary instance of this is a time-domain visual representation, a frequency-domain visual representation, and a spectrogram visual representation. These embodiments will be described in relation to this exemplary instance for clarity, but should not be considered limited by this example.

Figure 4A:
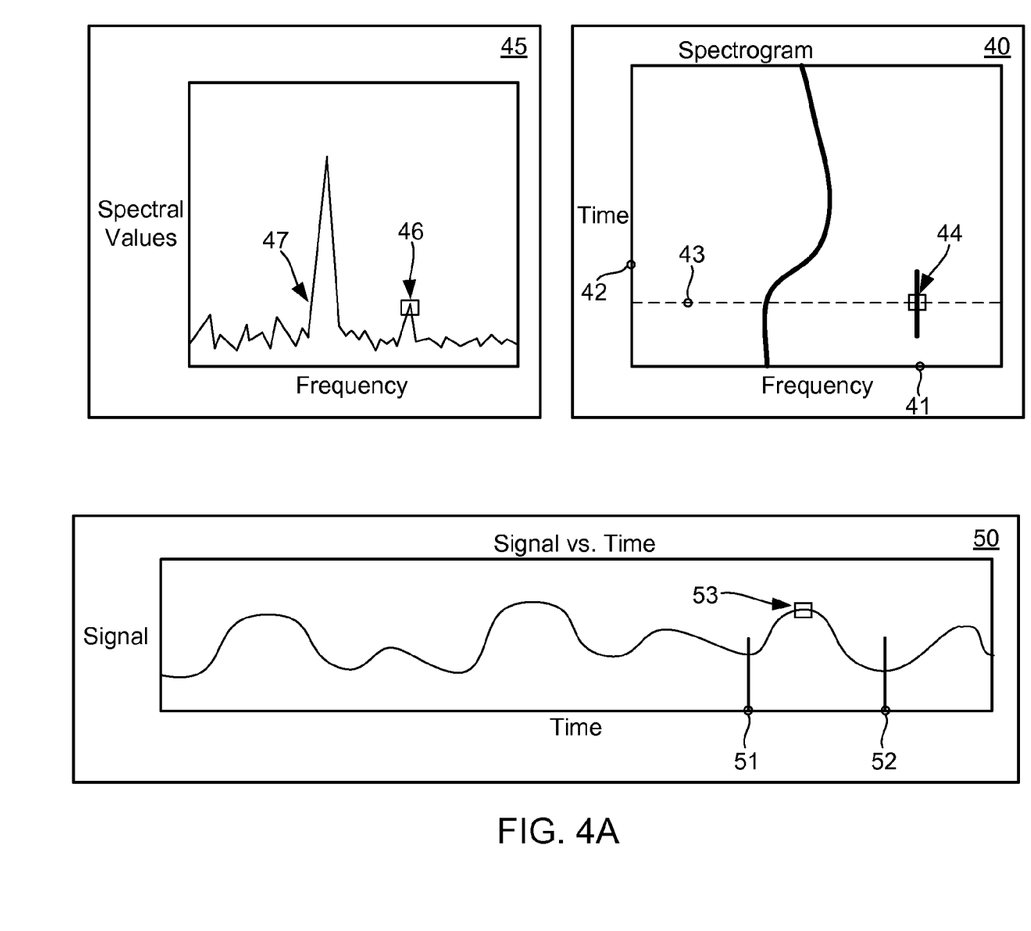
FIG. 4A is a diagram illustrating embodiments of the present invention comprising a frequency-domain visual representation, a time-domain visual representation, and a spectrogram visual representation.

FIG. 4A depicts three visual representations. The first visual representation 40 is a spectrogram visual representation showing frequency on the x-axis 41 and time on the y-axis 42. Each slice of the spectrogram corresponds to a single frequency spectrum calculated from one frame of time-domain data. For example, a slice along the line 43 may be shown 47 in the frequency-domain visual representation 45, and may correspond to the time frame of data shown in the time-domain visual representation 50 between times indicated by 51 and 52. When a display marker 44 is placed in the spectrogram 40, a corresponding, correlated display marker 46 may appear, under the management of a marker correlator, in the frequency-domain visual representation 45 on the frequency spectra 47 at the corresponding frequency. A corresponding, correlated display marker 53 may appear, under the management of a marker correlator, at any of the times between those indicated by 51 and 52 in the time-domain visual representation 50 as those are the limits of the time data underlying the frequency spectra 47 shown in the frequency-domain visual representation 45. The display marker 53 may be placed according to a placement rule such that the display marker is placed at the center of the frame as discussed above in relation to FIG. 2A-2E or at some other location in the range of values according to a placement rule used by the marker correlator.

Figure 4B:
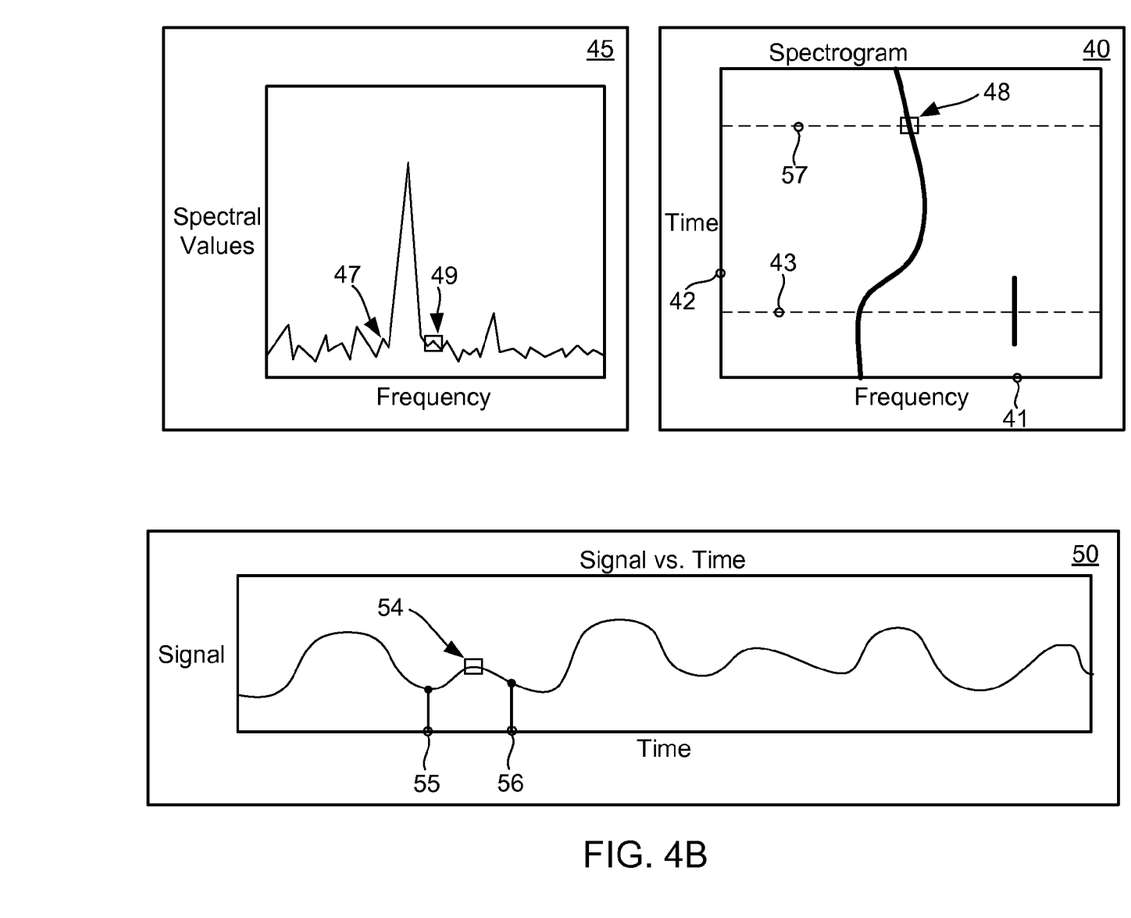
FIG. 4B is a diagram illustrating embodiments of the present invention comprising updating a marker position in a frequency-domain visual representation based only on marker frequency placement in a spectrogram visual representation.

In some embodiments, if a display marker 48 is placed, as shown in FIG. 4B, off of the line 43 that corresponds to the slice shown 47 in the frequency-domain visual representation 45, the marker correlator may effectuate display of a corresponding display marker 49 in the frequency-domain visual representation 45 at the frequency corresponding to the display marker 48 in the placement visual representation 40. In some embodiments, the marker correlator may induce an accompanying indication to the marker 49, for example reverse video, highlighting, semi-transparency, coloration, text display, or any other visual or audible indication, that the time attributes associated with the display marker 49 are not consistent for this alternate visual representation, the frequency visual representation 45 (i.e., the underlying time frame at the display marker in the spectrogram 40 is not represented in the frequency-domain visual representation 45). In some embodiments, the accompanying indication may be defined by a rule or definition used by the marker correlator. In alternate embodiments, the correlated display marker may not be displayed, according to the marker correlator, in the frequency-domain visual representation 45. A display marker 54 may be placed in the time interval corresponding to the underlying time data according to a placement rule used by the marker correlator, in the example that interval between 55 and 56, supporting the slice 57 on which the placed display marker 48 lies.

Figure 4C:
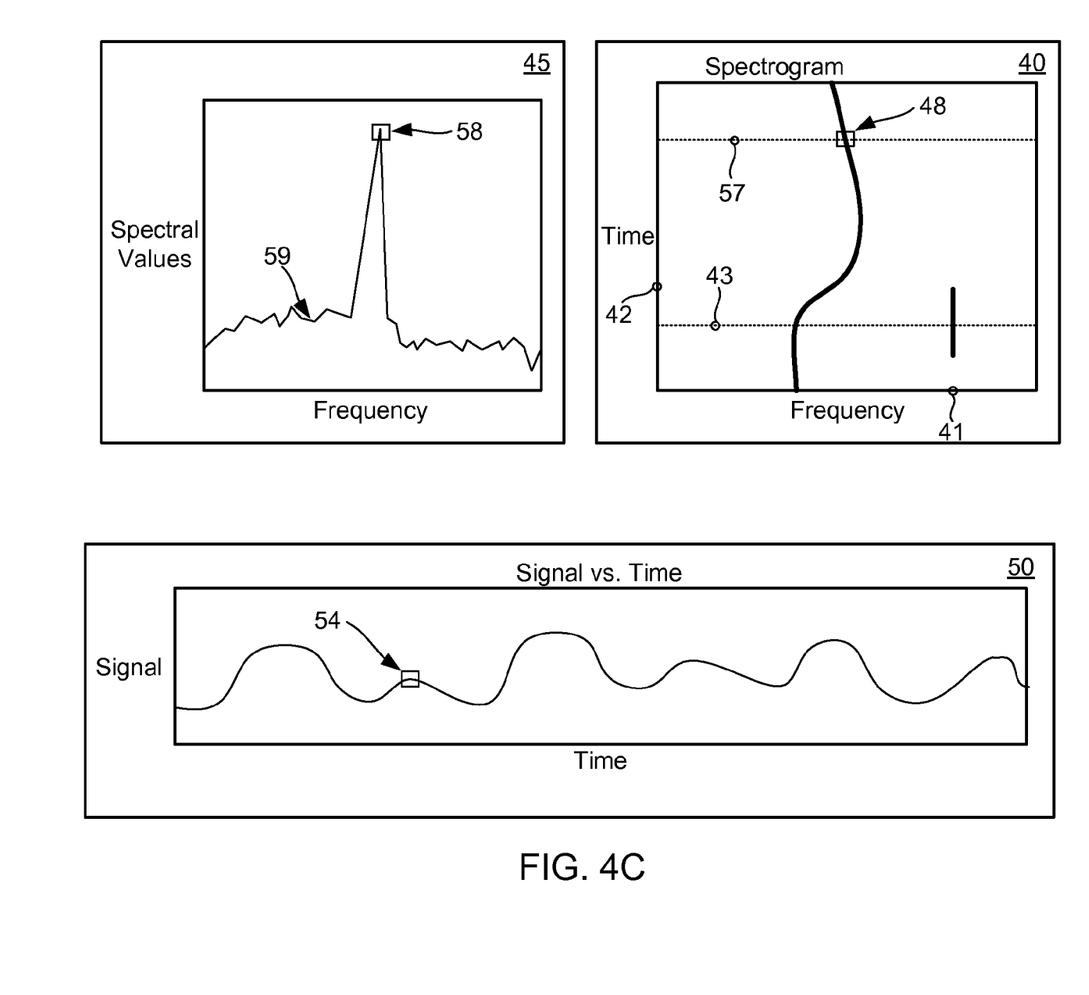
FIG. 4C is a diagram illustrating embodiments of the present invention comprising updating the frequency-domain visual representation and the marker position in the frequency-domain visual representation based on marker frequency placement in a spectrogram visual representation.

In alternate embodiments, if the display marker 48 is placed, as illustrated in FIG. 4C, off of the line 43 corresponding to the slice shown in the frequency-domain visual representation 45, the marker correlator may effect an update of the frequency-domain visual representation 45 to show the spectrum 59 corresponding to the slice 57 on which the placed display marker 48 lies. A corresponding, correlated display marker may be placed at location 58 according to the marker correlator.

Figure 4D:
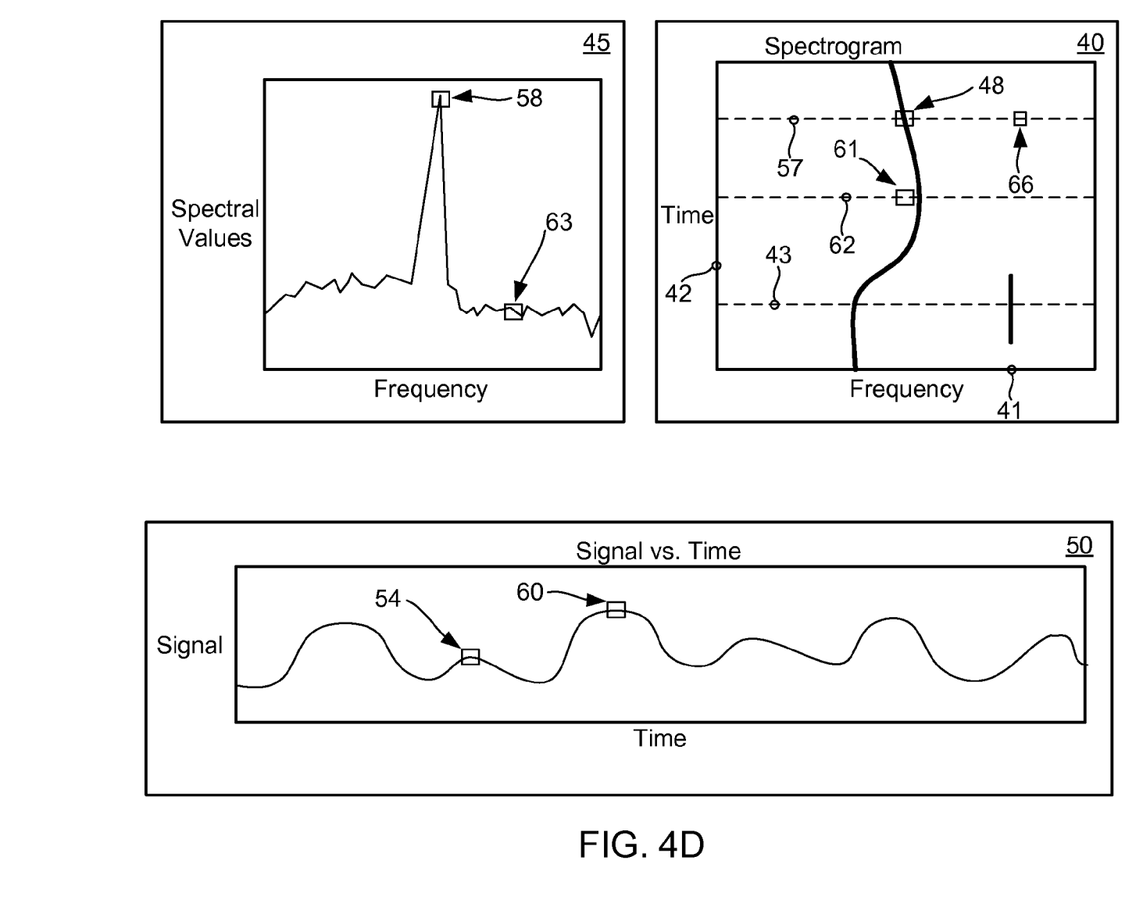
FIG. 4D is a diagram illustrating embodiments of the present invention comprising marker placement in the frequency-domain visual representation based on marker placement in the spectrogram visual representation.

In some embodiments, moving the display marker in the frequency-domain visual representation 45 may cause, as managed by the marker correlator, the corresponding, correlated display marker in the alternate visual representation, the spectrogram 40, to update in position to the corresponding frequency on the line 57. For example as illustrated in FIG. 4D, moving the display marker from location 58 to location 63 in the frequency-domain visual representation 45, may cause the corresponding, correlated display marker in the alternate spectrogram visual representation 40 to move from location 48 to location 66. The corresponding, correlated display marker in the alternate time-domain visual representation 40 may remain in the same location 54 since the underlying time data from which the slice is generated does not change.

Figure 4E:
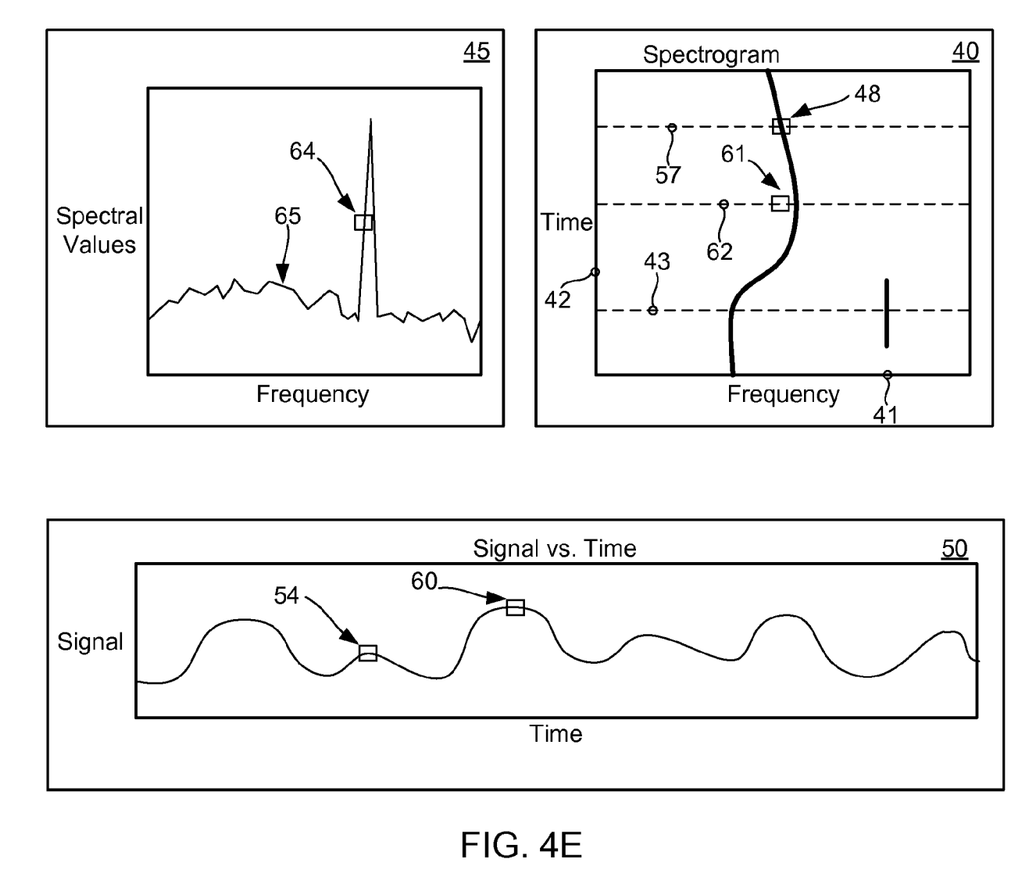
FIG. 4E is a diagram illustrating embodiments of the present invention comprising marker placement in the spectrogram visual representation based on marker placement in the time-domain visual representation.

In some embodiments, moving the display marker in the time-domain visual representation 50 may cause, through the marker correlator, the corresponding, correlated marker in the alternate spectrogram visual representation 40 to move to a corresponding time location. For example, moving the time-domain marker in the time-domain visual representation 50 from location 54 to location 60, may result in the corresponding, correlated display marker in the alternate spectrogram visual representation 40 moving from location 48 to location 61. In some embodiments, the marker correlator may effect no change in the frequency-domain visual representation 45. In alternate embodiments, due to the resulting movement of the marker in the spectrogram 40, the marker correlator may effectuate a display in the frequency-domain visual representation 45, of a new spectra 65 that corresponds to line 62 with the correlated display marker 64 displayed on the new waveform 65 at the corresponding frequency location, as shown in FIG. 4E.

In some embodiments of the present invention, a marker construct may have multiple domain variables each corresponding to one of multiple domains. Exemplary methods by which a domain variable may be set or changed include a user typing a value into an associated cell in a marker values table in a marker interface, a software process setting a domain value, a user dragging a display marker onto or within a visual representation, or any other method known in the art. A marker value retrieval process may access a measurement data set to find a measurement data point with a domain value nearest to a domain value stored in the marker construct. The marker value retrieval process may access the measurement data set to obtain the range value associated the domain value nearest to the domain value stored in the marker construct. The marker value retrieval process may report or otherwise deliver the domain and range values to any processes which require the values. Exemplary processes may include display processes, readout processes, external processes, device processes for use in an automated test system, or any other processes known in the art. The marker value retrieval process may retrieve range values in a plurality of measurement data sets using the appropriate domain value stored in the marker construct.

In some embodiments of the present invention, all markers activated on an instrument are markers capable of correlated display and managed by a marker correlator using a multi-domain marker construct. In alternate embodiments, a marker may be specially indicated as a marker capable of correlated display in alternate visual representations and managed by a marker correlator using a multi-domain marker construct.

In some embodiments of the present invention, a plurality of markers may exist, each with attributes for the independent- and dependent-axis domains of all visual representations produced by the measuring device.

Figure 5:
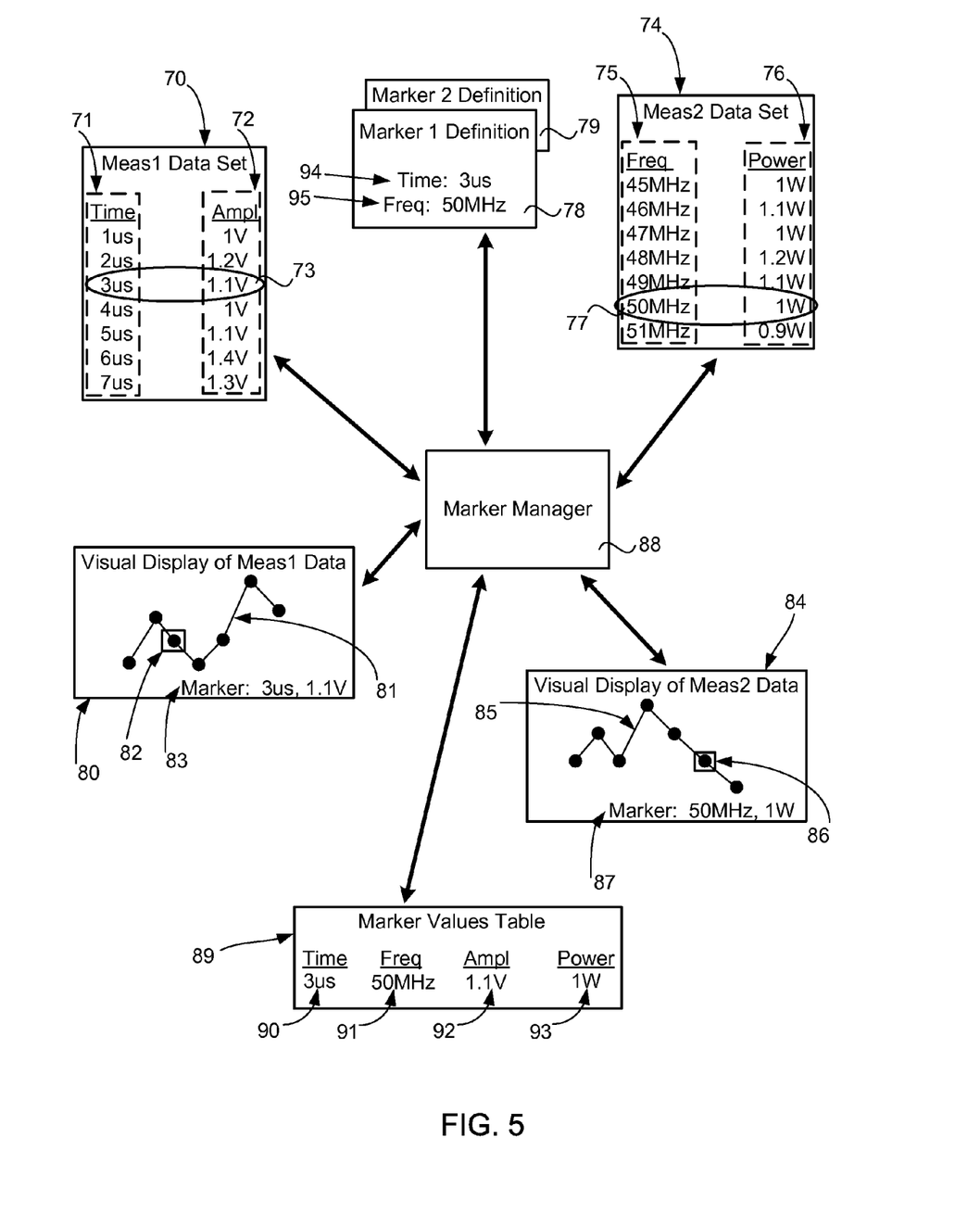
FIG. 5 is a diagram illustrating embodiments of the present invention comprising a marker manager.

Some embodiments of the present invention may be described with reference to FIG. 5. These embodiments may relate to a first data set 70, which may comprise first data set domain values 71 and first data set range values 72. The first data set 70 may associate one or more domain values 71 with one or more corresponding range values 72. A measurement data set may exist as a series of memory locations, an array, a data file, a database file or any other memory or storage entity. These embodiments may also relate to a second data set 74, which may comprise second data set domain values 75 and second data set range values 76. The second data set 74 may associate one or more domain values 75 with one or more corresponding range values 76.

Some of these embodiments may further comprise a first visual display 80, which may comprise a first visual representation 81. A first visual display 80 may also comprise a first visual marker icon 82 and a first visual marker readout 83. Some embodiments may also comprise a second visual display 80, which may comprise a second visual representation 81. A second visual display 80 may also comprise a second visual marker icon 82 and a second visual marker readout 83.

Some embodiments of the present invention may comprise a marker values table 89. This table may comprise domain values 90 and 91 that have been assigned to a marker along with range values 92 and 93 that are associated with the domain values 90 and 91. A marker values table may take the form of a graphical or textual element on a display, stored data or some other form that indicates the association of a marker's domain values 90 and 91 with corresponding range values 92 and 93 from one or more data sets, such as first data set 70 and second data set 74.

These embodiments may comprise a marker definition, such as marker 1 definition 78. A marker definition may comprise one or more domain values, such as first domain value 94 and second domain value 95. These domain values may be set by user input or by automated methods. Domain value input may comprise direct typing of domain values, input through a pointing device via a graphical user interface (GUI), automated input by a data selection process or by other selection processes. In some embodiments, a displayed marker values table 89 may provide for user input of domain or range values 90, 91, 92 and 93. In some embodiments, a user may input values by manipulating a visual marker icon 82 or 86 in a visual display 80 or 84.

These embodiments may also comprise a marker manager 88, which manages the input, association, storage, output and display of a marker. A marker manager 88 may receive input for the creation and modification of a marker definition 78. A marker manager 88 may also access a data set 70 or 74 and find any domain values 71, 75 or range values 72, 76 that are associated with domain or range values 94, 95 in a marker definition 78. These values may then be stored and/or displayed in a marker values table 89.

In some embodiments, a marker manager 88 may receive or detect a marker definition value 94 and find 73 an associated value in the corresponding data set 70. These values may then be displayed in a visual display 80, such as visual display 80, a displayed marker values table 90 and 92, a displayed marker readout 83, or some other display element. Marker definition values and values associated therewith through data sets may also be displayed as visual marker icons 82 and 86. A marker manager 88 may also store and/or output the marker definition values 94 and 95 to other processes.

In some embodiments of the present invention, a marker definition may comprise multiple values 94 and 95 from multiple domains. For example, a first domain value 94 may represent a time domain value and a second domain value 95 may represent a frequency domain value. These values 94 and 95 do not necessarily need to be correlated outside the context of the marker definition. The only correlation may be the marker definition itself. In some embodiments, marker definition values may be correlated by a mathematical relationship or some other relationship. In some embodiments, one marker definition value 94, from a first data set 70 may related to a second marker definition value 95 from a second data set 74 because the second data set 74 is a transform of the first data set 70.

In some embodiments, once a marker definition 78 has been created, a marker definition value 94 or 95 may be modified by user input. A user may modify a marker definition value 94, 95 by direct input of characters into a marker values table 89, a displayed marker readout 83, 87 or by some other mechanism for modification of the marker definition. In some embodiments, the marker definition values 94, 95 may also be modified by manipulation of a visual marker icon 82, 86. In these embodiments, a user may move a visual marker icon 82, 86 with a pointing device through a GUI system. As the marker icon 82, 86 is dragged along a visual data representation 81, 85, the marker definition value 94, 95 may be automatically updated to the value corresponding to the location where the user has placed the marker icon 82, 86.

When a marker definition value 94, 95 has been modified, the marker manager 88 may access an associated data set 70, 74 and find any domain or range values associated with the new marker definition value 94, 95. When a marker definition value 94, 95 is modified to a value that does not directly correspond to a value in an associated data set 70, 74, a nearest value to the marker definition value 94, 95 may be used to find an associated domain or range value. In some embodiments, values in a data set 70, 74 may be interpolated to estimate values between data points. When domain or range values associated 73, 77 with modified marker definition values 94, 95 are found, the marker manager 88 may send these new values to other processes. The new marker definition values 94, 95 may be sent to display processes to update visual maker icons 82, 86, visual marker readouts 83, 87, marker values tables 89 or other visual representations. These new values may also be stored and/or sent to non-display-related processes, such as other modules, instruments or devices.

In some embodiments of the present invention, a marker may exist independent of measurement results. The marker may have independent axis attributes, but null dependent axis values without underlying data from which to calculate the independent axis attributes.

The examples in the foregoing specification depict various relationships in a measurement data record between the underlying data sets of multiple visual representations. These relationships are by way of example. There is no limitation on the relationship of underlying data sets. For example: an underlying data set may comprise the entire data record or any portion of the data record; two underlying data sets may be entirely overlapping, partially overlapping, or disjoint; One underlying data set may be entirely contained in another underlying data set.

The examples in the foregoing specification are in specific domains for illustrative purposes, and there is no intention in the use of such domains to exclude alternate domains. There is no limitation on the number of visual representations. There is no limitation on the number, mixture, or distribution of domains in the multiple visual representations. Any number of visual representations, number of domains, mixture of domains or distribution of domains in the examples in the foregoing specification are for illustration only, and there is no intention in the examples to exclude alternate combinations.

The terms and expressions which have been employed in the foregoing specification are used therein as terms of description and not of limitation, and there is no intention in the use of such terms and expressions of excluding equivalence of the features shown and described or portions thereof, it being recognized that the scope of the invention is defined and limited only by the claims which follow.

What is claimed is:

1. A display apparatus, said apparatus comprising:
a) a display;
b) a first visual representation displayed on said display, wherein said first visual representation is based on a first data set in a measurement data record;
c) a second visual representation displayed on said display, wherein said second visual representation is based on a second data set in said measurement data record;
d) a first-visual-representation display marker associated with said first visual representation;
e) a second-visual-representation display marker associated with said second visual representation; and
f) a marker correlator wherein said marker correlator effectuates display of said second-visual-representation display marker in said second visual representation when said first-visual-representation display marker is placed in said first visual representation at a first location and when the data in said measurement data record corresponding to said first location is in said second data set;
wherein a marker-unavailable indication is displayed in said second visual representation when the data in said first data set corresponding to said first location is not in said second data set.

2. An apparatus according to claim 1 further comprising a marker construct wherein said marker construct comprises a plurality of domain-location variables.

3. An apparatus according to claim 1 further comprising storage for said measurement data record.

4. An apparatus according to claim 1 further comprising:
a) a first-visual-representation-marker readout wherein said first-visual-representation-marker readout displays a first range indicator and a first domain indicator; and
b) a second-visual-representation-marker readout wherein said second-visual-representation-marker readout displays a second range indicator and a second domain indicator.

5. An apparatus according to claim 1 wherein said first visual representation is in a first domain and said second visual representation is in a second domain.

6. An apparatus according to claim 1 wherein said marker correlator effectuates display of said first-visual-representation display marker in said first visual representation when said second-visual-representation display marker is placed in said second visual representation at a second location and when the data in said measurement data record corresponding to said second location is in said first data set.

7. An apparatus according to claim 1 wherein said marker correlator effectuates correlated display of said second-visual-representation display marker in said second visual representation when movement of said first-visual-representation display marker from a first display location in said first visual representation to a second display location in said first visual representation and when the data in said measurement data record corresponding to said second display location is in said second data set.

8. An apparatus according to claim 1 wherein said marker correlator effectuates correlated display of said first-visual-representation display marker in said first visual representation when movement of said second-visual-representation marker from a first display location in said second visual representation to a second display location in said second visual representation and when the data in said measurement data record corresponding to said second display location is in said first data set.

9. A display method, said method comprising:
   a) displaying a first visual representation on a display of a measurement instrument, wherein said first visual representation is based on a first data set in a measurement data record;
   b) displaying a second visual representation on said display, wherein said second visual representation is based on a second data set in said measurement data record;
   c) receiving a position of a first-visual-representation display marker associated with said first visual representation; and
   d) determining a correlated position of a second-visual-representation display marker associated with said second visual representation;
   e) wherein said determining comprises comparing the data in said measurement record corresponding to said position of said first-visual-representation display marker with the data in said second data set;
   wherein a marker-unavailable indication is displayed in said second visual representation when the data in said first data set corresponding to said first location is not in said second data set.

10. A method according to claim 9 further comprising a marker construct wherein said marker construct comprises a plurality of domain-location variables.

11. A method according to claim 9 further comprising:
   a) displaying a first-visual-representation-marker readout wherein said first-visual-representation-marker readout displays a first range indicator and a first domain indicator; and
   b) displaying a second-visual-representation-marker readout wherein said second-visual-representation-marker readout displays a second range indicator and a second domain indicator.

12. A method according to claim 9 wherein said first visual representation is in a first domain and said second visual representation is in a second domain.

13. A method according to claim 9 further comprising:
   a) receiving a position of a second-visual-representation display marker associated with said second visual representation; and
   b) determining a correlated position of a first-visual-representation display marker associated with said first visual representation;
   c) wherein said determining comprises comparing the data in said measurement record corresponding to said position of said second-visual-representation display marker with the data in said first data set.

14. A method according to claim 9 further comprising determining a correlated display location of said second-visual-representation display marker in said second visual representation when movement of said first-visual-representation display marker from a first display location in said first visual representation to a second display location in said first visual representation and when the data in said measurement data record corresponding to said second display location is in said first data set.

15. A method according to claim 9 further comprising determining a correlated display location of said first-visual-representation display marker in said first visual representation when movement of said second-visual-representation marker from a first display location in said second visual representation to a second display location in said second visual representation and when the data in said measurement data record corresponding to said second display location is in said first data set.

16. A display apparatus, said apparatus comprising:
   a) a display;
   b) a storage medium for storing a measurement data record;
   c) a first visual representation displayed on said display, wherein said first visual representation is a spectrogram;
   d) a second visual representation displayed on said display, wherein said second visual representation is a frequency-domain visual representation, wherein said frequency-domain visual representation is based on a first time frame;
   e) a third visual representation displayed on said display, wherein said third visual representation is a time-domain visual representation; and
   f) a marker correlator, wherein said marker correlator effectuates display of a second-visual-representation display marker in said second visual representation at a placement frequency and display of a third-visual-representation display marker in said third visual representation at a first time corresponding to a placement time frame when a first-visual-representation display marker is placed in said first-visual representation at a placement location, wherein said placement location comprises said placement frequency and said placement time frame.

17. An apparatus according to claim 16 further comprising a marker construct wherein said marker construct comprises a frequency variable and a time variable.

18. An apparatus according to claim 16 further comprising:
   a) a first-visual-representation-marker readout wherein said first-visual-representation-marker readout displays a first range indicator and a first domain indicator;
   b) a second-visual-representation-marker readout wherein said second-visual-representation-marker readout displays a second range indicator and a second domain indicator; and
   c) a third-visual-representation-marker readout wherein said third-visual-representation-marker readout displays a third range indicator and a third domain indicator.

19. An apparatus according to claim 16 further comprising updating said second visual representation to be that slice corresponding to said placement time frame and displaying said second-visual-representation marker on said updated second visual representation at said placement frequency.

* * * * *